United States Patent [19]

Gervay et al.

[11] 3,787,213

[45] Jan. 22, 1974

[54] PROCESS FOR MODIFYING SURFACES USING PHOTOPOLYMERIZABLE ELEMENTS COMPRISING HYDROPHILIC COLLOIDS AND POLYMERIZABLE MONOMERS

[76] Inventors: Joseph Edmund Gervay, 283 Spring St., Red Bank, N.J. 07701; Peter Walker, 81 Hialeah Dr., Colts Neck, N.J. 07722

[22] Filed: Jan. 19, 1972

[21] Appl. No.: 219,165

Related U.S. Application Data

[63] Continuation-in-part of Ser. No. 864,206, Oct. 6, 1969, abandoned, which is a continuation-in-part of Ser. No. 849,297, Aug. 7, 1969, abandoned, which is a continuation-in-part of Ser. No. 766,329, Oct. 9, 1968, abandoned.

[52] U.S. Cl. .................... 96/36, 96/36.3
[51] Int. Cl. .................... G03c 5/00
[58] Field of Search ........ 96/36, 35, 35.1, 83, 115 P

[56] References Cited

UNITED STATES PATENTS

| | | | |
|---|---|---|---|
| 3,469,982 | 9/1969 | Celeste | 96/83 X |
| 3,418,118 | 12/1968 | Thommes | 96/35.1 |
| 3,262,780 | 7/1966 | Thommes | 96/115 R |
| 2,760,863 | 8/1956 | Plambeck | 96/35.1 X |
| 2,299,839 | 10/1942 | McQueen | 96/35 X |
| 2,544,905 | 3/1951 | Van Deusen | 96/35 |

*Primary Examiner*—J. Travis Brown
*Assistant Examiner*—John L. Goodrow
*Attorney, Agent, or Firm*—William R. Moser

[57] ABSTRACT

A photopolymerizable dispersion coated on a hydrophobic strippable support and comprising a continuous phase with a hydrophilic organic, macromolecular polymer dispersion medium, e.g., gelatin, and a dispersed phase including at least one addition polymerizable ethylenically unsaturated monomer, e.g., an acrylic or methacrylic acid polyester such as pentaerythritol triacrylate, and a photoinitiator is used to make diffusion resist layers suitable for modifying imagewise, surfaces by diffusion etching, plating, dyeing, alteration of sensitivity of radiation-sensitive layers, etc. On exposure to actinic radiation, the dispersed monomer droplets, having a light-activatable initiating system in active association therewith, polymerize or harden to various degrees depending on the amount of actinic radiation received and the layer becomes resistant to diffusion of aqueous, or other normally gelatin diffusible liquids used to make solutions of materials used to modify a surface by diffusion treatment. Exposure may be through any suitable photographic stencil or pattern and this leaves an image in the resist-forming layer. The exposed resist layer may be pressed against and transferred to a moistened surface, e.g., a metal plate, and the hydrophobic support stripped off. The resist-bearing surface is then modified by diffusion of an aqueous, e.g., aqueous ferric chloride, etching solution to produce a permanently modified surface such as, in the case of using an aqueous ferric chloride etching solution applied to a copper surface, a gravure printing plate. The photopolymerizable dispersion may be coated directly on a surface to be modified and exposed through a suitable transparent photographic image, e.g., a halftone image or a gravure screen and a continuous tone image and etched and the resist removed. The photopolymerizable layer on the hydrophobic support may be laminated to the surface to be modified, and before or after removal of said support, the layer is exposed. The resist bearing surface can then be modified by diffusion etching, plating, e.g., electroplating, dyeing, alteration of the sensitivity of radiation-sensitive layers, etc.

12 Claims, No Drawings

PROCESS FOR MODIFYING SURFACES USING PHOTOPOLYMERIZABLE ELEMENTS COMPRISING HYDROPHILIC COLLOIDS AND POLYMERIZABLE MONOMERS

CROSS REFERENCE TO RELATED APPLICATIONS

This application is a continuation-in-part of Ser. No. 864,206, filed Oct. 6, 1969, which is a continuation-in-part of Ser. No. 849,297, filed Aug. 7, 1969, which is a continuation-in-part of Ser. No. 766,329, filed Oct. 9, 1968, all now abandoned.

BACKGROUND OF THE INVENTION

1. Field of the Invention

This invention relates to processes for modifying surfaces utilizing resists made from layers of heterogeneous photopolymerizable compositions. The resists are useful in the formation of etched gravure and lithographic printing plates, printed circuits, dyed images, silicon wafer electronic components, etc. The photopolymerizable layer comprises at least one ethylenically unsaturated monomer dispersed in a hydrophilic binder and an initiator activatable by actinic radiation. The photopolymerizable composition may also be coated directly on the surface to be modified.

2. Description of the Prior Art

It is known that photopolymerization can be carried out in such a manner as to reproduce original text and pictorial matter as shown in Assignee's Plambeck U. S. Pat. No. 2,760,863. Practical applications of such a process have been used, for example, in the preparation of relief letter-press-type printing plates by washout of unpolymerized areas. Thermal transfer of unpolymerized areas as disclosed in Assignee's Burg and Cohen U. S. Pat. No. 3,060,025, Oct. 23, 1962 can also be used. In compositions of the prior art, it is customary to employ homogeneous mixtures wherein the polymerizable monomer, the photoinitiator, and the binder are all within a single phase. In such a single phase system it is known that severe inhibition of the polymerization reaction is caused by the presence of oxygen. It has been difficult if not impossible to reproduce continuous tone images by photopolymerization of homogeneous compositions probably because of oxygen inhibition effect.

It is also known of course, to prepare gravure etching resists using a stripping film having a gelatino-silver halide emulsion thereon in the manner taught by Assignee's Grumbine, U. S. Pat. No. 2,993,792. This method and element have enjoyed considerable commercial success. However, the process of use involves several steps which include developing and fixing of the exposed silver halide in liquid processing solutions and which require highly skilled technicians to carry out. It further requires washing of the unexposed areas of the resist with hot water to remove said areas from the surface before the conventional ferric chloride etching solution is used.

In Thommes and Walker, U. S. Pat. No. 3,418,118, patented Dec. 24, 1968, and in Assignee's copending application, namely Chang and Walker, Ser. No. 640,496 filed May 23, 1967, issued as U. S. Pat. No. 3,579,339 on May 18, 1971, there are described heterogeneous photopolymerizable compositions which are less subject to the above discussed inhibiting effect of oxygen. Such compositions are coated to form both monolayer and multilayer elements which contain part of a color image-yielding composition developable by chemical action in a wet processing solution and are useful in forming colored images. It is not evident from these applications that similar compositions free of conventional color image-yielding compositions could be used to modify surfaces by etching, electroplating, dyeing, etc., by means of diffusion treatments with the appropriate solution.

SUMMARY OF THE INVENTION

The photopolymerizable dispersion useful in the processes of this invention comprises a hydrophilic, organic, macromolecular polymer dispersion medium including a dispersed phase containing:

1. at least one ethylenically unsaturated monomer having a boiling point above 100°C. at normal pressure, being capable of forming a high polymer by free-radical initiated, chain-propagating addition polymerization, and 2. a free-radical photoinitiator activatable by actinic radiation in an amount of from 0.01 to 20.0 percent by weight of the total solids in the composition.

The invention relates to a process for modifying the surface of an article bearing a photopolymerizable, resist-forming layer, said layer being comprised of a hydropholic, macromolecular organic polymer dispersion medium including a dispersed phase containing at least one ethylenically unsaturated monomer having a boiling point above 100°C. at normal atmospheric pressure and being capable of forming a high polymer by free-radical initiated, chain-propagating addition polymerization and a free-radical generating photoinitiator system activatable by actinic radiation in an amount constituting from 0.01 to 20.0 percent by weight of the total solids in said dispersion, said monomer and initiator being the sole image forming system in the layer, comprising the steps of exposing said article to actinic radiation in an image pattern, and modifying the surface of said article in conformance with said image pattern by diffusing a treating fluid through the unpolymerized areas of said layer. The latter step of diffusing through the unpolymerized areas is meant to designate diffusion through the layer governed by the degree of polymerization of the areas of the layer. The less polymerized the areas of the photopolymerizable layer are, the more the treating fluid will diffuse through them. Surface modification according to the above described process can therefore be effected in a continuous manner from the least to the most polymerized areas of the layer, thus permitting surface modification according to a continuous tone image.

The invention also includes elements having a layer of the dispersion and to processes for modifying surfaces in various manners by diffusion treatment with etching, plating, dyeing materials, etc., in gelatin diffusible liquids. As gelatin diffusible liquids there may be mentioned, water, dimethyl formamide, dimethyl sulfoxide, etc. A method for forming a gravure printing plate for example comprises, in either order, (a) exposing to actinic radiation such a layer coated on a support, e.g., transparent film support first through a gravure screen and then to a continuous tone image transparency which gives an image in the resist modulated by photopolymerization, and (b) adhering the surface of said layer to the surface to be imaged which has been moistened with water and peeling off the transparent film support, then (c) etching the surface to produce an intaglio printing surface with conventional etching solution, e.g., ferric chloride, (d) washing the etched surface, e.g., with hot water to remove the residual etching solution and the photopolymer resist. The process may also be carried out by exposing the layer to the gravure screen through the transparent support and to the continuous tone image from the opposite side. In addition, the dispersion may be coated directly on the surface to be etched. Other processes for modifying surfaces, which may be carried out utilizing the novel heterogeneous layers of this invention, are electroplating and permanently dyeing layers, e.g., polymeric dye receptive layers and porous aluminum surfaces.

The invention comprises diffusing a treating fluid through a photopolymerizable layer of the type described in an image pattern and is useful for any surface modification obtainable thereby. For example, the surface can be built up or plated, dyed, etched, etc. The type of surface modification effected will depend on the treating fluid and surface chosen. Numerous types of surface modification are exemplified herein.

In one embodiment of the process, a treating fluid is diffused through the unpolymerized areas and a second treating fluid is subsequently applied which diffuses through the polymerized areas also. This and other variations of the process of the invention that rely on imagewise diffusion of at least one treating fluid through the layer are within the scope of the invention.

DESCRIPTION OF THE PREFERRED EMBODIMENTS

In preparing a preferred photopolymerizable dispersion and layer for use in this process, an aqueous solution or dispersion of a macromolecular organic polymer, e.g., an aqueous gelatin solution, is stirred under high shear during the addition of a non-aqueous or oil phase comprising a solution of at least one addition polymerizable monomer or polymerizable polymer and a photo initiator in an organic solvent therefor, e.g., ethyl acetate. In order to obtain good dispersions of photopolymerizable droplets, effective surfactants should be present. The surfactant can be admixed with the aqueous gelation solution. A single addition polymerizable monomer such as pentaerythritol triacrylate is generally satisfactory although a combination of monomers may be used. Polymerizable polymers having a linear carbon backbone chain with extralinear, terminal, ethylenically unsaturated groups such as those disclosed in Assignee's Schoenthaler U. S. Pat. No. 3,418,295 and Celeste U. S. Pat. No. 3,448,089 may also be used. Other agents may be added to the coating composition to control the coating properties and/or the photopolymer reaction mechanism, e.g., crosslinking agents such as N,N′-methylenebisacrylamide, and diacetone acrylamide, supplemental binders, e.g., polyacrylamide, plasticizers, e.g., glycerol, and a thermal polymerization inhibitor, e.g., p-methoxyphenol, etc. may be used. Ethyl acetate is a suitable choice as an organic solvent in making heterogeneous photopolymer systems because it has a low boiling point and can be removed easily before coating the dispersion without recourse to high temperatures that could damage the emulsion. Also it is a good solvent for the oil phase. Ethyl acetate for example can be removed by heating the dispersion to 50°C. in a rotary evaporator.

Coatings may also be made without using a low boiling solvent. In these cases the oil phase is dissolved in a water-miscible high boiling solvent, e.g., 2-methoxyethanol. This latter system works as well as the temporary low-boiling, water-immiscible, solvent system and eliminates the step of removing said low boiling solvent by evaporation before coating the dispersion. The size of the dispersed photopolymerizable droplets ranges from 0.1 to 10 microns with the majority being about 0.5 micron. Uniformity of dispersion is directly related to the length of time and degree of blending agitation. Dyes for control of halation and image coloration may also be added to the system.

As ethylenically unsaturated compounds there may be used the monomers set forth in Assignee's Plambeck, U. S. Pat. No. 2,760,863, patented Aug. 28, 1956, those set forth in Celeste and Bauer, U. S. Pat. No. 3,261,686, patented July 19, 1966, those disclosed and claimed in Cohen and Schoenthaler, U. S. Pat. No. 3,380,831 patented Apr. 30, 1968, the polymerizable polymers disclosed and claimed in Assignee's U. S. Pat. Nos., Schoenthaler 3,418,295 patented Dec. 24, 1968 and Celeste 3,448,089 patented June 3, 1969.

Useful free-radical photoinitiators are those disclosed in Plambeck, U. S. Pat. Nos. 2,760,863 patented Aug. 28, 1956, Notley, 2,951,758 patented Sept. 6, 1960, and any of the photoreducible dyes and reducing agents listed in Oster, U. S. Pat. Nos. 2,850,445; 2,875,047; 3,097,096; and Oster et al., U. S. Pat. Nos. 3,074,794; 3,097,097 and 3,145,104. Depending on the initiating system employed, a single component may be used such as the polynuclear quinones or a polynuclear quinone and another initiator, e.g., Michler's ketone or a multi-component system such as a photoreducible dye and a free-radical producing agent, as described below, can be used.

The thickness of the photopolymerizable layers may vary widely depending upon the type of resist desired. It may vary from 0.0001 inch to 0.001 inch or thicker. Preferably the thickness ranges from 0.0004 to 0.0007 inch.

The dispersions preferably are coated on a flexible, hydrophobic, strippable film support using a suitable coating apparatus, for instance, at a temperature of about 35°C. and about 24 feet per minute. The film supports may also be treated by exposure to an electrical discharge after the manner described in Traver U. S. Pat. No. 3,113,208 or exposed to an air/propane flame after the manner described in Bryan, U. S. Pat. No. 3,145,242. The coatings are set by chilling and dried at room temperature. The gelatin concentration of the coating composition is the direct determinant of emulsion viscosity and, thus, the indirect determinant of coating weight. The thickness of the dried coated layers will be about 0.0004 to 0.0007-inch, but this is not at all critical and can easily be adjusted, depending on the type of resist and the etching characteristics desired. The support need not be, but preferably is, a transparent hydrophobic film support. Films made of superpolymers such as polyethylene terephthalate are particularly suitable. A gelatin antiabrasion layer about 0.00001 – 0.0003 inch thick, containing a surfactant, may be provided on the photopolymerizable layer.

The process of forming the resist images may be performed in any of the conventional ways of making resist images except that it is unnecessary, as required by the prior art, to remove the unexposed portions of the layer by washing and before etching the support, e.g., copper surface with aqueous ferric chloride solutions. A convenient method of exposure is by means of a vacuum printing frame as exemplified by the Flip Top nuArc Plate Maker exposing device using a xenon lamp as the source of radiation and manufactured by the nuArc Co., Inc., Chicago Ill.

Two exposures can be made on the photosensitive resist layer for conventional gravure. One exposure is through a conventional lateral gravure screen followed by an exposure through a continuous tone transparency either negative or positive. The screen exposure may be to the surface of the photosensitive layer or through the transparent support on which the photosensitive layer is coated provided no nonhalation layer has been coated on the back surface. It has been found, surprisingly, that by exposing through the support, the dots have a more desirable configuration. This is because this method prevents undercutting during etching. Undercutting has long been a problem in the gravure field.

The screen can have a ratio of dot width to line of 1:1 although this is not at all critical and may be varied, i.e., 2½:1. A single exposure is used where the image being exposed through is already a gravure halftone image.

After the exposing steps, where the dispersion has been coated on a film support, the surface of the exposed layer is adhered to the surface which is to be etched imagewise. The surface to be etched is moistened and the exposed layer transferred by rolling the film resist under a rubber roller into contact with the moistened surface, e.g., a copper plate. The surface to be etched must be thoroughly cleaned to remove impurities such as grease and tarnish. In the case of a copper plate, the surface may be cleaned with the following solution:

| | |
|---|---|
| Glacial acetic acid | 50 ml. |
| Sodium chloride | 250 grams |
| Distilled water | 950 ml. |

After cleaning with the above solution, the plate can be scoured by rubbing with moist Vienna lime, and finally dried. The cleaning process makes the surface sufficiently wettable by water even though, basically, the surface is hydrophobic. After laydown, the transparent film support is removed from the resist layer by lifting a corner and peeling it back and away from the copper plate.

After removal of the film support, an etching solution, e.g., ferric chloride 41–42 Baume', is applied to the resist surface for approximately 25 to 35 minutes or until the plate is etched to the required depth. The image is etched in inverse proportion to the amount of hardening in the resist layer because the ferric chloride diffuses through the gelatin at a rate depending on the degree of hardening of the photosensitive layer. Etching may also be done using more than one etching solution, e.g., 44 Be' for 44 minutes and then 40 Be' for 5 minutes.

After etching is completed the copper plate is given a brief flushing with cold water to stop the action of the etching solution, and then the resist layer is removed with hot water.

Among the procedures for exposing the photopolymerizable layer are

A. Expose the layer through a contacting gravure screen and then through a contacting continuous tone image. See Examples I–V and VII–XV.

B. Expose the layer through a gravure screen in contact with the support and then through a continuous tone image on the support. See Examples VI and VII.

C. Expose the layer through a halftone image. See Example I.

D. Expose the layer through a halftone and a continuous tone image.

The invention will now be illustrated in and by the following Examples.

EXAMPLE I

An aqueous dispersion was made using the following ingredients:

| | |
|---|---|
| Gelatin | 18.0 g. |
| Water | 250.0 ml. |
| Gum arabic (5% aqueous solution) | 20.0 ml. |
| N,N'-methylenebisacrylamide | 0.5 g. |
| Glycerol | 2.0 ml. |
| Ethyl acetate | 40.0 ml. |
| Benzyl alcohol | 0.5 ml. |
| 9,10-Phenanthrenequinone | 80.0 mg. |
| 4,4'-methenyl-bis-(1-(p-sulfophenyl)-3-methylpyrazolone-5) | 100.0 mg. |
| Polyacrylamide (M.W. 5–6,000,000) | 0.5 g. |
| Pentaerythritol triacrylate | 8.0 g. |
| Acrylated glycidyl methacrylate/acrylonitrile/methyl methacrylate terpolymer (Example V of Schoenthaler U.S. Pat. No. 3,418,295, Dec. 24, 1958) | 0.5 g. |
| Mixture of mono + diesters of phosphoric acid with ethylene oxide condensate of nonyl phenol containing about 10 ethylene oxide units/chain | 0.2 g. |

The dispersion was prepared by agitating in a Waring blender the gelatin, water, gum arabic for 30 seconds, after these ingredients have been soaked and warmed to dissolve them in the conventional manner, followed by the addition of the rest of the ingredients and continuing the agitation for 90 seconds. The ethyl acetate was removed by heating to about 50°C. using a rotary evaporator.

The resulting emulsion was coated under yellow safelight on a polyethylene terephthalate film support at 24 feet per minute at 35°C. The resulting coating was then dried in a conventional manner leaving a photopolymerizable layer having a thickness of about 0.0005 inch.

The resulting film was exposed by placing a 150 line gravure screen having a dot width to line ratio of 2½:1 in contact with the emulsion surface and placing in a vacuum frame in a Flip Top Xenon nuArc Plate Maker (nuArc Co., Inc., Chicago, Illinois). The exposure time was 4 minutes and the distance from the film to the xenon arc lamp was 18 inches. The screen was then removed and a $\sqrt{2}$ step wedge was put in place of it on the surface of the emulsion and the film exposed for 2 minutes. After exposure, the emulsion surface was adhered to a water-wetted copper plate by means of rubber rollers. The copper plate, before the lamination, is cleaned as described above. The plate is then wetted with distilled water containing 1 percent ammonia for the lamination step.

After the lamination or laydown, the film support is removed from the resist by lifting a corner and peeling back and away from the copper plate. This stripping step is preferably but not necessarily done immediately after the laydown step.

After the stripping step, the areas of the plate not covered by the exposed layer were treated with asphaltum to prevent etching in these areas as is conventional in the gravure art. The plate was etched for about 35 minutes using a 41–42 Baume' ferric chloride solution. When etching was completed the copper plate was flushed with hot water to stop the action of etching and to remove the resist layer from the copper plate. A good, high quality variable depth image showing 6 $\sqrt{2}$ steps of the wedge etched into the copper plate. The cell wall width was 40 μ in the highlights and 35 μ in the shadows. The cell depth in the shadows was about 30 μ at a density of 1.1, and 10 μ at a density of 0.35. The process was also carried out using a continuous tone positive image in place of the step wedge to form an etching resist and subsequently after etching a high quality gravure printing plate which when placed in a gravure printing press gave good reproductions of the original positive image. The photosensitive element may also be exposed through a gravure halftone positive image to provide a high quality gravure printing plate. A simple of the photosensitive element was exposed to a printed circuit positive image for 3 minutes in the above exposing apparatus and then laminated to a copper-clad phenolformaldehyde resin plate. The film support was dry-stripped from the laminated element. The copper was etched away completely in 40 minutes using the above 41–42 Baume' ferric chloride solution leaving an image of the circuit. By washing with hot water the high quality copper circuit is left on the phenol-formaldehyde resin plate.

EXAMPLE II

An aqueous dispersion was made according to Example I except that 25 ml. of 2-methoxyethanol was used in place of the ethyl acetate and was not removed after the mixing of the dispersion. The dispersion was coated, exposed and processed as described in Example I to give etching resists of comparable quality.

EXAMPLE III

An aqueous dispersion was made using the following ingredients:

| | |
|---|---|
| Gelatin | 18 g. |
| Water | 350 ml. |
| Gum arabic (5% aqueous solution) | 20 ml. |
| N,N'-methylenebisacrylamide | 0.5 g. |
| Glycerol | 2.0 ml. |
| Ethyl acetate | 40.0 ml. |
| Benzyl alcohol | 0.5 ml. |
| 9,10-Phenanthrenequinone | 100.0 mg. |
| 4,4'-Methenyl-bis(1-(p-sulfophenyl)-3-methylpyrazolone-5) | 100.0 mg. |
| Pentaerythritol triacrylate | 13.0 g. |
| Acrylated glycidyl methacrylate/acrylonitrile/methyl methacrylate terpolymer (Example V of Schoenthaler U. S. Pat. No. 3,418,295) | 0.5 g. |
| Mixture of mono + diesters of phosphoric acid with ethylene oxide condensate of nonyl phenol containing about 10 ethylene oxide units/chain | 0.2 g. |
| Ethylene oxide ester of mono and dioxtyl phosphate | 0.2 g. |

The dispersion was prepared by agitating in a blender, the gelatin, water, gum arabic for 30 seconds followed by addition of the rest of the ingredients and continuing agitation for 90 seconds. The ethyl acetate was removed by heating to about 50°C. using a rotary evaporator.

The resulting emulsion was coated, dried and processed as described in Example I to give good resist layers by means of which intaglio printing plates were obtained which gave good reproductions. Printed circuits can also be obtained using the same general methods.

EXAMPLE IV

Example III was repeated except that 0.5 gram of polyacrylamide and 5 more grams of pentaerythritol triacrylate were added to the formula of that Example. Coated resists gave improved results in terms of increased speed of 5 times, and in density gradation, which is attributed to the increase in the monomer concentration in the composition.

EXAMPLE V

An aqueous dispersion was made using the following ingredients:

| | |
|---|---|
| Gelatin | 18.0 g. |
| Water | 350.0 mls. |
| Gum arabic (5% aqueous solution) | 20.0 mls. |
| N,N'-methylenebisacrylamide | 0.5 g. |
| Glycerol | 2.0 mls. |
| 2-Methoxyethanol | 25.0 mls. |
| Benzyl alcohol | 0.5 ml. |
| 9,10-Phenanthrenequinone | 100.0 mgs. |
| 4,4'-methenyl-bis(1-(p-sulfophenyl)-3-methylpyrazolone-5) | 100.0 mgs. |
| Polyacrylamide (M.W. 5–6,000,000) | 0.5 g |
| Trimethylolpropane triacrylate | 18.0 g. |
| Mixture of the mono + diesters of phosphoric acid with ethylene oxide condensate of nonyl phenol containing about 10 ethylene oxide units/chain | 0.2 g. |

The ingredients were mixed as described in Example I and coated, dried and processed to form resists from which gravure plates were made.

EXAMPLE VI

An aqueous dispersion was made using the following ingredients:

| | |
|---|---|
| Gelatin | 18.0 g. |
| Water | 350.0 mls. |
| Gum arabic (5% aqueous solution) | 20.0 mls. |
| Glycerol | 2.0 mls. |
| 2-Methoxyethanol | 25.0 mls. |
| Benzyl alcohol | 0.5 ml. |
| 9,10-Phenanthrenequinone | 100.0 mgs. |
| 4,4'-methenyl-bis(1-(p-sulfophenyl)-3-methylpyrazolone-5) | 100.0 mgs. |
| Polyacrylamide (M.W. 5–6,000,000) | 0.5 g. |
| Trimethylolpropane triacrylate | 15.0 gs. |
| Mixture of the mono + diesters of phosphoric acid with ethylene oxide condensate of nonyl phenol containing about 10 ethylene oxide units/chain | 0.2 g. |

The ingredients were mixed, coated,dried and processed as in Example I to form resists having a thickness of 0.0005 inch from which gravure plates were made. The coating was exposed through a gravure screen in contact with the film support and to a continuous tone $\sqrt{2}$ step wedge image from the opposite side. An image of 12 $\sqrt{2}$ steps was obtained. The plate was etched for 21 minutes in 41–42° Baume' ferric chloride solution. By this method, the gravure wells and cell walls were improved considerably in shape and thickness, and it obviated any tendency toward undercutting by the etching solution. The cell depth at a density of 0.18 was 8 microns, and at a density of 1.86, the depth was 28 microns. The cell wall thickness in the shadows was 10 microns.

EXAMPLE VII

Example VI was repeated except that 40 mls. of the low-boiling solvent, ethyl acetate was used in place of the 2-methoxyethanol and 0.5 gram of N,N'-methylenebisacrylamide was added. This solvent was removed by evaporation as in Example I. Results similar to those of Example VI were obtained.

EXAMPLE VIII

An aqueous dispersion was prepared using the following ingredients:

| | |
|---|---|
| Gelatin | 18.0 gs. |
| Water | 350.0 mls. |
| N,N'-methylenebisacrylamide | 0.5 g. |
| Glycerol | 2.0 mls. |
| 2-Methoxyethanol | 25.0 mls. |
| Benzyl alcohol | 0.5 mls. |
| 9,10-Phenanthrenequinone | 150.0 mgs. |
| 4,4'-methenyl-bis(1-(p-sulfophenyl)-3-methylpyrazolone-5) | 100.0 mgs. |
| Polyacrylamide (M.W. 5–6,000,000) | 0.5 g. |
| Trimethylolpropane triacrylate | 15.0 gs. |
| Mixture of the mono + diesters of phosphoric acid with ethylene oxide condensate of nonyl phenol containing about 10 ethylene oxide units/chain | 0.2 g. |

The coated photosensitive layer was exposed to a gravure screen (1:1 dot to line ratio) through the emulsion side for 3 minutes and then to a continuous tone positive for 1 minute. The etched gravure plate showed good well formation and good cell wall structure having substantially the same dimensions as Example VI. The higher amount of initiator appeared to contribute to the quality of the etched image, along with the different gravure screen ratio (1:1).

EXAMPLE IX

An aqueous dispersion was prepared using the following ingredients:

| | |
|---|---|
| Gelatin | 18.0 g. |
| Water | 350.0 mls. |
| Gum arabic (5% aqueous solution) | 20.0 mls. |
| N,N'-methylenebisacrylamide | 0.5 g. |
| Glycerol | 2.0 mls. |
| 2-Methoxyethanol | 30.0 mls. |
| Benzyl alcohol | 0.5 ml. |
| 9,10-Phenanthrenequinone | 100.0 mg. |
| 4,4-Methenyl-bis(1-(p-sulfophenyl)-3-methylpyrazolone-5) | 100.0 mg. |
| Pentaerythritol triacrylate | 8.0 g. |
| Trimethylolpropane triacrylate | 8.0 g. |
| Polyacrylamide (M.W. 5–6,000,000) | 0.5 g. |
| Mixture of the mono + diesters of phosphoric acid with ethylene oxide condensate of nonyl phenol containing about 10 ethylene oxide units/chain | 0.2 g. |

A satisfactory gravure printing plate was obtained from the photosensitive layer which had a dry thickness of 0.0005 inch by coating the resulting dispersion on a polyethylene terephthalate film as described in Example I.

EXAMPLE X

Example VIII was repeated using 100 milligrams of the photoinitiator, 2,7-di-tertiary-butylphenanthrenequinone in place of 9,10-phenanthrenequinone. Results comparable to that Example were obtained.

EXAMPLE XI

Example VIII was repeated using 100 milligrams 4,4'-bis-dimethylaminobenzophenone (Michler's ketone) in place of 9,10-phenanthrenequinone as the initiator with results comparable to those obtained in that Example.

EXAMPLE XII

Example VIII was repeated using 22.5 grams of trimethylolpropane triacrylate instead of 15 grams. Decreasing the gelatin-monomer ratio improved the resolution and increased the speed of the photosensitive layer 4 times withut any decrease in the quality of the etched image on the gravure plate.

EXAMPLE XIII

Example VIII was repeated except that 18 grams of trimethylolpropane triacrylate was used and 25 milligrams of p-methoxyphenol, a thermal polymerization inhibitor, was added to the formula. The incorporation of the thermal polymerization inhibitor into the emulsion resulted in a decrease in speed of the resist. The resist layer was 0.0005 inch in thickness and, after exposure and the laydown on a copper plate was described in Example I, a good, high quality gravure printing plate was obtained by etching through the resist layer.

EXAMPLE XIV

Example VIII was repeated except that 0.5 gram of diacetone acrylamide was used in place of N,N'-methylenebis-acrylamide and 18 grams of trimethylolpropane triacrylate was used in the composition. This formula provided a good photosensitive resist layer when coated as described in Example I.

While the invention is primarily directed to emulsion layers containing only a small amount of an antihalation dye, colorant dyes may be incorporated in the layers, for various reasons. A group of useful dyes are those which are photoreducible and in color image producing systems the color is removed preferentially in exposed areas leaving behind a positive colored image in the film resist. Suitable dyes such as Safranine Bluish (C.I. Basic Violet 5), Rose Bengal (C.I. Acid Red 94) Proflavine (3,6-diaminoacridinium mono-hydrogen sulfate), Methylene Blue (C.I. Basic Blue 9), Erythrosin B (C.I. Acid Red 51) and Azure A (C. I. Pigment Blue 29) when incorporated in the system will produce a positive image on exposure to actinic radiation, and in some cases is accompanied by an improvement in speed or light sensitivity when compared to the previous Examples I – XIII not containing the photoreducible dyes. Any of the dyes may be used in combination.

EXAMPLE XV

An aqueous dispersion was made using the following ingredients:

| | |
|---|---|
| Gelatin | 18.0 g. |
| Water | 350.0 ml. |
| Diacetone acrylamide | 0.9 g. |
| Glycerol | 2.0 ml. |
| 2-Methoxyethanol | 25.0 ml. |
| Benzyl alcohol | 0.5 ml. |
| 9,10-Phenanthrenequinone | 200.0 mg. |
| 4,4'-methenyl-bis(1-(p-sulfophenyl)3-methylpyrazolone-5) | 100.0 mg. |
| Polyacrylamide (M.W. 5–6,000,000) | 0.5 g. |
| Trimethylolpropane triacrylate | 18.0 g. |

| | |
|---|---|
| Mixture of the mono + diesters of phosphoric acid with ethylene oxide condensate of nonyl phenol containing about 10 ethylene oxide units/chain | 0.2 g. |
| Thionine (Lauth's Violet - C.I. 52000) | 100.0 mg. |

The dispersion was prepared by blending as described in Example I. The resulting emulsion which had a blue color was coated under yellow safelight at 24 ft. per minute at 35°C. on a transparent 0.007 inch thick polyethylene terephthalate film support. The coating was dried and the dried layer had a thickness of approximately 0.0006 inch. The resulting photosensitive layer was exposed to actinic radiation through a gravure screen (150 line, 2½:1 dot to line ratio) for 3 minutes and then to a continuous tone positive transparency for 1 minute in the exposing apparatus described in Example 1. A blue colored positive image resulted by virtue of the fact that during photopolymerization in the exposed areas the dye was photobleached. Lamination and etching were carried out as described above to leave a high quality gravure plate.

EXAMPLE XVI

Example XV was repeated using 200 mg. of thionine instead of 100 mg. and 200 mg. Michler's ketone in place of the 9,10-phenanthrenequinone. Results were comparable to those in that Example.

EXAMPLE XVII

Example XV was repeated using 300 mg. of thionine instead of 100 mg. and 100 mg. of 9,10-phenanthrenequinone and 100 mg. of Michler's ketone as the initiating system. The antihalation dye was omitted from the composition. A high quality gravure plate was obtained.

EXAMPLE XVIII

The dispersion of Example XIV was coated at 95°F. directly on a copper plate prepared as described above. The plate was dried to about 0.001 inch. The layer was exposed to a halftone positive for 3 minutes, as described in Example I, and etched to give a gravure halftone image of variable size dots and wells of equal depth.

EXAMPLE XIX

Example XV was repeated using 100 mg. of Safranine Bluish (C.I. Basic Violet No. 5) in place of the thionine and 150 mg. of 9,10-phenanthrenequinone. The resulting coated layer had a thickness of 0.0006 inch and a magenta positive image resulted from exposure to actinic radiation. A speed increase of 12 steps on the $\sqrt{2}$ step wedge was observed as compared to standard compositions without Safranine Bluish.

EXAMPLE XX

Example XV was repeated except that 100 mg. of Azure-A (C.I. Pigment Blue 29) was used in place of thionine and 150 mg. of 9,10-phenanthrenequinone and 100 mg. of Michler's ketone was used as the initiating system. The antihalation dye was omitted from the emulsion, but a carbon black antihalation layer was coated on the back of the support. On exposure, blue positive image was obtained in the resist layer. A gravure plate of comparable quality was obtained on etching for 50 minutes in 43.5° Baume' ferric chloride solution and 10 minutes in a 40.5° Baume' solution and removal of the resist layer. The photospeed of the resist increased by 9 steps on the step wedge ($\sqrt{2}$) compared to standard coatings without Azure A. The cell depth at a density of 0.45 was 8 microns, and at a density of 1.59, the depth was 30 microns. The wall width in the highlights was 50 microns and 54 microns in the shadows.

EXAMPLE XXI

Example XV was repeated using 150 mg. of 9,10-phenanthrenequinone as the initiating system and 100 mg. of 4,4'-methenyl-bis(1-(p-sulfophenyl)-3-methyl pyrazolone-5). The results were comparable to previous examples, except that the speed of the resist increased 7 steps ($\sqrt{2}$ step wedge) compared to standard compositions without Azure A.

EXAMPLE XXII

A 0.007-inch sheet of polyethylene terephthalate was treated on one surface with a copolymer subbing composition, and provided with a gelatin anchoring layer as in Example IV of Alles U. S. Pat. No. 2,779,684. The following coating composition was prepared:

| | |
|---|---|
| Water | 6,000 g. |
| Gelatin | 1,000 g. |

The composition was soaked for 10 minutes at room temperature, and heated for 25 minutes at 125°C., and then cooled to 105°F., at which time there was added a mixture of

| | |
|---|---|
| Ethanol | 1,300 g. |
| Water | 1,300 g. |

and admixed, in order, the following materials:

| | |
|---|---|
| p-Tert-butylphenyl diethoxy sulfonate (28% conc.) | 440 ml. |
| 3N NaOH | 300 ml. |
| Solution A | |
| Water | 1830 g. |
| 4,4'-Methenyl-bis-(1-(p-sulfo-phenyl)-3-methyl-pyrazolone-5) | 320 g. |
| Solution B | |
| Water | 1950 g. |
| 2-Hydroxy-4-methoxy-5-sulfobenzophenone | 200 g. |
| Solution C | |
| Water | 2050 g. |
| C.I. fluorescent brightening agent 26 | –100 g. |

The resulting dispersion was skim-coated to a thickness of 0.00025 inch on the treated surface of the support.

A dispersion was prepared by mixing the following aqueous and organic phases in a Kady dispersion mill (Model LB, manufactured by Kinetic Dispersion Corp., Buffalo, N.Y., 14225) and blending for 15 minutes.

| Aqueous Phase | |
|---|---|
| Gelatin | 18 g. |
| Water | 300 ml. |
| Polyacrylamide | 0.5 g. |
| Mixture of the mono + diesters of phosphoric acid with ethylene oxide condensate of nonyl phenol containing about 10 ethylene oxide units/chain | 0.4 g. |

| Aqueous Phase | |
|---|---|
| 22% yellow pigment (Dalamar Yellow, C.I. 11741) dispersed in water with 6% nonyl phenoxy poly-(ethoxy) ethanol 73% combined ethylene oxide based on weight of nonyl phenol | 1 g. |
| **Organic Phase** | |
| Trimethylolpropane triacrylate | 15 g. |
| Mixed ester of triethylene glycol dicaprate and dicaprylate | 3 g. |
| o-Chlorophenyl 4,5 bis (m-methoxy-phenyl) imidazolyl dimer | 1.2 g. |
| Tris-4 (diethylamino-o-tolyl) methane | 0.8 g. |
| 4-Methoxyphenol | 5 mg. |
| Chloroform | 20 ml. |

The resulting emulsion (pH = 5) was then skim-coated to the untreated side of the support under yellow light at 90°F. at a rate of 40 ft./min. The coating was dried in a conventional manner leaving a photopolymerizable layer having a thickness of 0.00044 inch.

The photopolymerizable film was exposd by placing a 150-line gravure screen in contact with the emulsion surface and placing it in a Flip Top Carbon nuArc Plate Maker. The film was exposed for 2 minutes at a distance of 18 inches from the carbon arc. The screen was then removed and a 21 step $\sqrt{2}$ step wedge was put in place of it on the surface of the film, and the element exposed for 5 seconds. After exposure, the emulsion surface was cleaned and adhered through rubber rollers to a wetted copper plate as in Example I. The copper was wetted, after cleaning and prior to lamination, with a mixture (1:1) of distilled water and methanol.

After lamination, the film support is removed from the resist by peeling back and away from the copper plate.

After stripping the support, the areas of the plate not covered by the exposed layer were treated with asphaltum. The plate was then etched for 38 minutes using a 45.5° Baume' ferric chloride solution. After the etching was completed, the copper was flushed with hot water to stop the action of etching and to remove the resist layer from the copper plate. A high-quality, variable-depth image showing 5 $\sqrt{2}$ steps of the wedge etched into the copper plate was obtained.

The process was also carried out using an image-bearing gravure halftone positive instead of the gravure screen and a continuous tone positive image of the same in place of the $\sqrt{2}$ step wedge to form an etching resist. After etching, a high quality gravure printing plate having variable depth and also variable dot size was obtained.

The photosensitive element may also be exposed through a gravure halftone positive image only to provide high quality variable depth and also variable dot size gravure printing plate.

All plates yielded good printed images, when used to print on an appropriate printing press.

EXAMPLE XXIII

The following aqueous dispersion was made and coated according to Example XXII to yield a photopolymerizable layer having a thickness of 0.00043 inches.

| | |
|---|---|
| Gelatin | 18 g. |
| Water | 350 ml. |
| Polyacrylamide | 0.5 g. |
| Mixture of mono and diesters of phosphoric acid with ethylene oxide condensate of nonylphenol containing about 10 ethylene oxide units/chain | 0.4 g. |
| 2-Hydroxy-4-methoxy-5-sulfobenzo-phenone | 3 g. |
| Trimethylolpropane triacrylate | 15 g. |
| Mixed ester of triethylene glycol, dicaprate and dicaprylate | 3 g. |
| o-Chlorophenyl-4,5-bis (m-methoxy phenyl) imidazolyl dimer | 1.2 g. |
| [4,4',4''-Methylidynetris (N,N-dimethylaniline)] | 0.8 g. |
| 4-Methoxyphenol | 5 mg. |
| 2-Methoxyethanol | 30 ml. |
| Acetone | 15 ml. |

The film was exposed to the carbon arc first through a 150 line gravure screen for 4 minutes, followed by a 20 second continuous tone exposure to a $\sqrt{2}$ step wedge. Processing was the same as in Example XXII. 55 Minutes etching in 45.5° Baume' ferric chloride yielded gravure plates of comparable quality to those obtained in Example XXII, using the same techniques.

A dark violet-colored negative image is noticeable on the resist during the tone exposure. This is due to the fact that in the exposed areas the leuco dye is oxidized and thereby develops color.

EXAMPLE XXIV

The following antiabrasion overcoat composition was prepared:

| | |
|---|---|
| Water | 18,750 g. |
| Gelatin | 250 g. |

This was soaked for 10 minutes at room temperature, then digested for 25 minutes at 120°F., and cooled to 90°F.

The phosphate ester of Example XXIII, 250 ml. was added, and then there was added the following solution:

| | |
|---|---|
| Ethanol | 250 g. |
| Water | 250 g. |

The composition was overcoated on a photopolymer layer prepared as in Example XXII, to a thickness of 0.0001 inch. The thickness of the dried film (photopolymer plus overcoat) was 0.00045 inch. The film was exposed through a gravure screen to a UV source (Ascor Addalux) for 2 minutes at a distance of 24 inches, followed by a continuous tone exposure for 15 seconds yielding a dark violet negative image. On etching with a 45.5° Baume' ferric chloride solution for 45 minutes, good quality variable depth images were obtained on copper plates. Similar high quality gravure printing plates were obtained when the element was exposed to single halftone gravure positives, and etched.

EXAMPLE XXV

| Aqueous Phase | |
|---|---|
| Gelatin | 540 g. |
| Water | 8,000 ml. |
| Mixture of mono + diesters of phosphoric acid with ethylene oxide condensate of nonylphenol containing on the average of 10 ethylene oxide units/chain | 15 g. |
| 22% yellow pigment (Dalamar Yellow, (C.I. 11741) dispersed in water with 6% nonyl phenoxy poly-(ethoxy) oxide based on weight of nonylphenol | 45 g. |
| **Organic Phase** | |
| Trimethylolpropane triacrylate | 300 g. |
| Mixed ester triethylene glycol dicaprate and dicarpylate | 150 g. |
| 2-t-Butylanthraquinone | 15 g. |

The aqueous and organic phases were mixed and blended for 15 minutes in a Kady dispersion mill. The emulsion was then skim-coated at 90°F. at 40 ft./min. to a polyethylene terephthalate base (7 mil) as in Example XXII. The dried photopolymer layer was 0.00054-inch thick. The film resist was exposed through a gravure screen for 6 minutes to a carbon arc (nuArc), and then to a two continuous tone step wedge. The exposed resist was laminated to a copper plate which was moistened with a 1:1 ethanol/water mixture and the bare portions of copper were masked with acid resistant tape.

Etching was performed using a 45.5° Baume' ferric chloride solution, for 35 minutes. A high-quality variable depth gravure plate was obtained showing 9 steps of the 2 wedge etched in the copper.

EXAMPLE XXVI

| | |
|---|---|
| Gelatin | 18 g. |
| Water | 300 ml. |
| Mixture of mono + diesters of phosphoric acid with ethylene oxide condensate of nonylphenol containing about 10 ethylene oxide units/chain | 0.5 g. |
| Trimethylolpropane triacrylate | 10 g. |
| Carbon black | 1 g. |
| Mixed ester triethylene glycol dicaprate and dicaprylate | 5 g. |
| Phenanthrenequinone | 0.1 g. |

The phenanthrenequinone was dissolved in the mixture of trimethylolpropane triacrylate, and mixed triethylene glycol ester. The 2 phases were mixed and blended for 3 minutes in a Kady dispersion mill. The emulsion was coated to a thickness of 0.0006-inch exposed and processed as in Example XXV. 6 minute exposure to a gravure screen, followed by a 10 second tone exposure to a $\sqrt{2}$ step wedge, produced a high quality gravure plate upon etching in a 45.5° Baume' ferric chloride solution for 39 minutes.

EXAMPLE XXVII

| | |
|---|---|
| Gelatin | 18 g. |
| Water | 300 ml. |
| Mixture of the mono + diesters of phosphoric acid with ethylene oxide condensate of nonyl phenol containing about 10 ethylene oxide units/chain | 0.5 g. |
| Carbon black | 1 g. |
| Trimethylolpropane triacrylate | 10 g. |
| Mixed ester triethylene glycol dicaprate and dicarpylate | 5 g. |
| 2-t-Butylanthraquinone | 0.5 g. |

The anthraquinone initiator was dissolved in the mixture of trimethylolpropane triacrylate and triethylene glycol mixed ester. The aqueous and organic phases were mixed and blended for 3 minutes. The resulting emulsion was coated, dried and processed as set out in Example XXIV. Three-minute gravure screen exposure, followed by a 20 second continuous tone exposure and 38 minutes etching in 45.5° Baume' ferric chloride, yielded gravure plates comparable to those obtained in previous Examples.

EXAMPLE XXVIII

An aqueous dispersion was made as described in Example VIII, except that 100 mg. of 9,10-phenanthrenequinone was used instead of 150 mg. The photopolymerizable dispersion was coated and dried under a yellow safelight on a polyethylene terephthalate film support, as described in Example I. The coated film was laminated by means of rubber rollers to a water-wetted copper plate, which had been previously cleaned, as described above. The polyethylene terephthalate film support was stripped off and the photopolymerizable layer was exposed first to a gravure screen (2½:1 dot to line ratio) for 4 minutes in the exposing device of Example I and then to a $\sqrt{2}$ continuous tone step wedge for 2 minutes. The exposed image was etched with 41.8° Baume' ferric chloride solution for 35 minutes to give a good quality copper plate having a well depth at density of 1.62 of 25 microns and a cell wall thickness of 20 microns which have a good quality halftone image reproduction.

EXAMPLE XXIX

A dispersion was prepared by mixing the following aqueous and organic phases in a Kady dispersion mill and blending for 15 minutes.

| Aqueous Phase | |
|---|---|
| Gelatin | 18 g. |
| Water | 325 ml. |
| Polyacrylamide | 0.5 g. |
| Mixture of the mono and diesters of phosphoric acid with ethylene oxide condensate of nonylphenol containing about 10 ethylene oxide units/chain | 0.4 g. |
| 22% yellow pigment (Dalamar Yellow, C C.I. 11741) dispersed in water with 6% nonylphenoxy poly(ethoxy) ethanol 73% combined ethylene oxide based on the weight of nonylphenol | 1.0 g. |
| **Organic Phase** | |
| Trimethylolpropane triacrylate | 15 g. |
| Mixed ester of triethylene glycol dicaprate and dicaprylate | 3 g. |
| o-Chlorophenyl-4,5-bis(m-methoxy phenyl)imidazolyl dimer | 3 g. |
| Tris-4-(dimethylamino-o-tolyl) methane | 1.5 g. |
| [4,4',4''-Methylidynetris(N,N-dimethylaniline)] | 0.3 g. |
| 4-Methoxyphenol | 5.0 mg. |
| Methylene chloride | 25 ml. |

The resulting emulsion was coated on a polyethylene terephthalate film support and dried. The photopolymerizable layer surface was laminated to a water-wetted cleaned copper plate. The photopolymerizable layer on the copper plate was exposed through the film support to a gravure screen halftone step wedge by means of a UV source in an Ascor Addalux exposing device (Model No. 1412-01, manufactured by the Berkey Technical Division of Berkey Photo Inc., Woodside, New York 11377) at a distance of 60 inches for 3 minutes. The film support was stripped off and the exposed plate was etched with 44° Baume' ferric chloride for 30 minutes. The plate was then rinsed with hot water to stop the etching action and to remove the resist layer from the copper plate. A good quality gravure plate was obtained which showed at a step density of 0.35 a well depth of 45 microns and a wall width of 20 microns.

EXAMPLE XXX

A dispersion was prepared by mixing the following aqueous and organic phases in a blender for 5 minutes.

| Aqueous Phase | |
|---|---|
| Polyvinyl Alcohol (Elvanol 72–60 grade) manufactured by E. I. du Pont de Nemours and Company. Viscosity of a 4% aqueous solution at 20°C. as determined by Hoeppler falling ball method is 55–65 centipoises | 9.0 g. |
| Polyvinyl Alcohol (Elvanol 50–42 grade). Viscosity determined as above 35–42 centipoises | 9.0 g. |
| Water | 400 ml. |
| Mixture of the mono and diesters of phosphoric acid with ethylene oxide condensate of nonylphenol containing about 10 ethylene units/chain | 0.5 g. |
| 22% yellow pigment (Dalamar Yellow, C.I. 11741) with 6% nonylphenoxy poly(ethoxy) ethanol 73% combined ethylene oxide based on weight of nonylphenol | 1.5 g. |
| Organic Phase | |
| Trimethylolpropane triacrylate | 9.5 g. |
| Mixed ester of triethylene glycol dicaprate and dicaprylate | 3 g. |
| o-Chlorophenyl-4,5-bis(m-methoxyphenyl)imidazolyl dimer | 3.7 g. |
| Tris-4(diethylamino-o-tolyl)methane | 0.2 g. |
| 4,4',4''-Methylidynetris(N,N-dimethylaniline) | 0.4 g. |
| Methylene chloride | 10.0 g. |

The resulting emulsion was coated on the untreated side of the polyethylene terephthalate film described in Example XXII under a yellow light and dried. The element was exposed at 26 inches through a gravure halftone screen step wedge for 15 seconds and the surface of the exposed layer was laminated to a copper plate, the film support stripped off and the copper plate etched in 44.5° Baume' ferric chloride for 17 minutes to give a good quality gravure plate. The process was repeated except that the surface of the photo-polymerizable layer was laminated to the copper plate first and then exposed after stripping off the film support. Etching as described above gave an acceptable gravure printing plate capable of giving good gravure image reproduction.

EXAMPLE XXXI

A dispersion was prepared by mixing the following aqueous and organic phases in Kady dispersion mill and blending for 15 minutes.

| Aqueous Phase | |
|---|---|
| Gelatin | 18 g. |
| Water | 325 ml. |
| Poly(vinyl pyrrolidone)(Avg.M.W. 40,000) (25% methylene chloride solution) | 1 g. |
| Mixture of mono and diesters of phosphoric acid with ethylene oxide condensate of nonyl phenol containing about 10 ethylene oxide units/chain | 0.4 g. |
| Organic Phase | |
| Trimethylolpropane triacrylate | 15 g. |

-Continued

| Aqueous Phase | |
|---|---|
| Mixed ester of triethylene glycol dicaprate and dicaprylate | 3 g. |
| o-Chlorophenyl-4,5-bis(m-methoxyphenyl) imidazolyl dimer | 3 g. |
| Tris-4(diethylamino-o-tolyl)methane | 1.5 g. |
| [4,4',4''-Methylidynetris(N,N-dimethylaniline)] | 0.3 g. |
| 4-Methoxyphenol | 5.0 mg. |
| Methylene chloride | 25 ml. |

The resulting emulsion was coated on a strippable hydrophobic polyethylene terephthalate film support and dried. The resulting photopolymerizable element was exposed to a positive transparency of a printed circuit by means of a Flip Top Carbon nuArc Plate Maker. The surface of the photopolymer layer of the exposed element was laminated to a water moistened copper surface by means of rubber rollers at room temperature. The hydrophobic polyethylene terephthalate support was removed by stripping. After removal of the support the resist layer on the copper surface was immersed in a copper pyrophosphate electroplating bath for a period of about 5 minutes, to form a plated image of the printed circuit by diffusion of the plating solution through the unexposed areas of the resist layer. This method of modifying a copper surface by further plating of copper finds great utility in the field of manufacturing electronic components. For example the copper surface may comprise an epoxy fiberglass board having a very thin layer of copper thereon. By plating such a board with copper to build up the thin copper layer in the image areas, removing the resist layer and controllably etching the board with aqueous ferric chloride solution to remove the thin copper layer in the nonimage or background areas, a high quality printed circuit can be obtained.

EXAMPLE XXXII

Example XXXI was repeated except that the copper surface was diffusion-treated with a nickel sulfamate plating solution which formed a good quality nickel image on the copper surface. By etching with ferric chloride, after removal of the resist, a nickel plated copper printed circuit can be obtained on the fiberglass board.

EXAMPLE XXXIII

Example XXXI was repeated except that the copper surface was diffusion-treated with an aqueous tin/lead plating bath comprising stannous fluoroborate, lead fluoroborate, fluoroboric acid and boric acid, which formed a good quality tin/lead solder image on the copper surface. By laminating a resist image of solder points onto a previously prepared printed circuit of copper on a fiberglass board and plating by diffusion through the resist image of the solder points where components or connections are to be attached with a solution of tin/lead compounds and removing the resist layer, a printed circuit board can be made which allows an operator to make soldered connections merely by localized heating.

EXAMPLE XXXIV

Example XXXI was repeated except that the unexposed resist was first laminated to a conventional silicon wafer used as an electronic component and then exposed to a positive transparency of the desired circuit. After exposure, the silicon wafer and attached exposed resist was immersed in a 6–1 aqueous bath of 40 percent ammonium fluoride and 48 percent hydrofluoric acid for 15 minutes. The resist was then removed with hot water leaving the wafer having the circuit from which nonconductive silicon dioxide had been etched away. The wafer could then be further processed in a conventional manner to form the desired electronic component.

EXAMPLE XXXV

On a 0.004 inch thick polyethylene terephthalate film containing an anchoring layer as described in Alles et al. U. S. Pat. No. 2,627,088 there was coated the following composition:

| | |
|---|---|
| Poly(methyl methacrylate/ethyl acrylate/methacrylic acid) (66/29/5) | 32.0 g. |
| Trimethylolpropane ethylene oxide triacrylate adduct | 10.0 g. |
| Mixed esters of triethylene glycol dicaprate and dicaprylate | 3.0 g. |
| o-Chlorophenyl-4,5-bis(m-methoxy-phenyl) imidazolyl dimer | 0.3 g. |
| 2-Mercaptobenzotriazole | 0.1 g. |
| Ethanol | 60.0 g. |

The layer was dried and then laminated with a sheet of 0.001 inch thick polyethylene terephthalate film and flash exposed to a 275 watt G.E. Sunlamp for 2 minutes at a distance of 1 foot. The 0.001 inch thick polyethylene terephthalate film was stripped off and to the surface of the photopolymerized layer there was laminated the surface of the photopolymerizable resist layer of the element of Example XXXI. This photopolymerizable resist layer was exposed through an image transparency to a UV source (Ascor Addalux) and the hydrophobic film stripped off. Samples of the resulting exposed element were immersed for 2 minutes in aqueous dye solution each containing 20 grams of sodium sulfate per 100 ml. of solution, one containing Malachite Green (C.I. No. 42000) and the other containing Du Pont Sevron Brilliant Red. The samples were removed from the dye baths and the resist layers were removed, showing a good quality dyed image which could be used in an overlay system, or the receptive layers could be thermally transferred to form direct positive multicolor proofs.

A negative working system can also be carried out by first treating the unit containing the laminated imaged resist with a solution of ferric chloride which deactivates the receptor layer. Upon subsequent immersion in the dye solution, the dye slowly diffuses through the exposed areas of the resist layer and dyes the layer to give a good quality complimentary image of the original transparency through which the resist was exposed.

EXAMPLE XXXVI

A photopolymerizable dispersion was prepared by mixing the following aqueous and organic phases in a kinetic dispersion mill and blending for 15 minutes.

| Aqueous Phase | |
|---|---|
| Gelatin | 18.0 g. |
| Water | 325.0 ml. |
| Polyacrylamide | 0.25 g. |
| Mixture of mono and diesters of phosphoric acid with ethylene oxide condensate of nonyl phenol containing about 10 ethylene oxide units/chain | 0.25 g. |
| Dalamar Yellow (C.I. 11741) (Pigment) | 1.5 g. |
| **Organic Phase** | |
| Trimethylolpropane triacrylate | 15.0 g. |
| Mixed ester of triethylene glycol dicaprate and dicaprylate | 5.0 g. |
| 2(o-Chlorophenyl)-4,5-diphenyl-imidazoyl dimer | 2.2 g. |
| 4-Methoxyphenol | 10.0 mg. |
| Tris-4 (diethylamino-o-tolyl) methane | 1.0 g. |
| [4,4',4''-Methylidynetris(N,N-dimethylaniline)] | 0.4 g. |
| Methylene chloride | 3.3 ml. |

The resulting emulsion was coated as described above on a hydrophobic strippable polyethylene terephthalate film. The copper surface of a commercially grained bimetallic plate of stainless steel having electroplated thereon approximately 0.001 inch thick layer of copper was cleaned by immersing the plate in a dilute nitric acid solution (approximately 2 percent) and then rinsed with water and air-dried. The surface of the resist layer of the above coated element was laminated to the copper surface of the bimetallic plate, said copper surface having been moistened with a 50-50 methanol-water solution just prior to lamination. The hydrophobic polyethylene terephthalate film was stripped off and the photopolymerizable layer was imagewise exposed as described above. The exposed resist layer was etched conventionally using a 44° Baume' ferric chloride solution for about 15 minutes including swabbing the resist until all of the copper was removed from the steel under the unexposed areas of the resist. At the end of the etching process the residual etching solution and the resist layer were removed from the metal plate with hot water. The resulting plate was placed on an offset printing press and high quality lithographic reproductions were obtained.

EXAMPLE XXXVII

A dye receptor layer was prepared using the following composition:

| | |
|---|---|
| Chlorinated rubber (Parlon S—5 by Hercules Powder Co.) (67% chlorinated rubber - 20% solution in toluene at 25°C. has a viscosity of 4–7 centipoises) | 22 g. |
| Pentaerythritol triacrylate | 17 g. |
| Triethylene glycol diacetate | 1 g. |
| 2,2'-Methylene-bis(4-ethyl-6-t-butylphenol) | 1 g. |
| 2-Tertiary-butylanthraquinone | 2.1 g. |
| Solvent Red (C.I. 109) | 0.1 g. |
| Trichloroethylene | 180.0 g. |

The ingredients were thoroughly mixed and coated on a 0.001 inch thick transparent polyethylene terephthalate film support to give a dry layer of 0.0006 inch in thickness. Then the surface of the photopolymerizable layer of a resit film element made as described in Example XXXI was laminated to the surface of the dry receptor layer of the above described composition. The hydrophobic polyethylene terephthlate support of the resist element was removed by stripping. The resist element was exposed imagewise to a carbon arc (nuArc) and then a solution of dimethyl sulfoxide containing 1% by weight of Victoria Pure Blue dye (C.I. 44045) was poured over the surface of the exposed resist layer. After 6 hours the resist layer was removed with hot water. A good quality blue image of the original was found on the dye receptor layer.

The above diffusion dyeing process was also carried out using dimethylformamide in place of dimethyl sulfoxide as the solvent for the dye. The resist layer could also be imagewise exposed before lamination and removal of the hydrophobic strippable support.

EXAMPLE XXXVIII

A dispersion was prepared by mixing the following aqueous and organic phases in the dispersion mill described in Example XXII and milling for 15 minutes.

| Aqueous Phase | |
|---|---|
| Gelatin | 200 g. |
| Water | 2,517 g. |
| Polyvinyl pyrrolidone (M.W. 40,000) | 8.28 g. |
| Saponin | 3.33 g. |
| Mixture of mono and diesters of phosphoric acid with ethylene oxide condensate of nonyl phenol containing about 10 ethylene oxide units/chain | 5.5 g. |
| Sodium octyl sulfate | 3.33 g. |
| Dalamar Yellow (C.I. 11741) (Pigment) | 33.3 g. |
| Organic Phase | |
| Trimethylol propane triacrylate | 133.3 g. |
| Mixed ester of triethylene glycol dicaprate and dicaprylate | 22.2 g. |
| o-Chlorophenyl-4,5-bis(m-methoxyphenyl)imidazolyl dimer | 16.7 g. |
| 2(o-Chlorophenyl)-4,5-diphenyl-imidazolyl dimer | 16.7 g. |
| [4,4',4''-Methylidynetris(N,N-dimethylaniline)] | 1.67 g. |
| 4 4'-Bisdiethylaminobenzophenone | 61.0 g. |
| Methylene chloride | 83.0 g. |

After the milling step the following materials were added to and mixed with the dispersion:

| | |
|---|---|
| Water | 1,700 g. |
| Silica (finely divided - Silica No. 73 sold by Davison Division of W. R. Grace Company) | 9.35 g. |

The resulting composition was coated on a hydrophobic polyethylene terephthalate strippable support and dried. The film was exposed to a 150 line (2½:1 dot to line ratio) gravure screen by means of the exposing device described in Example XXIX and then to a $\sqrt{2}$ step wedge for 2 minutes. The surface of the exposed layer was laminated to a water-wetted cleaned copper plate and the hydrophobic support was removed by stripping. The copper plate with the exposed layer was etched in 42° Baume' ferric chloride for 30 minutes to give a good quality gravure plate having a well depth at density of 1.65 to 35 microns and a cell wall thickness of 15 microns and at a density of 0.35, a cell depth of 2 microns and a cell wall thickness of 45 microns.

With the addition of silica to the photopolymerizable dispersion it was not necessary to coat the surface of the photopolymerizable layer with an antiabrasion layer as described in Example XXIV. The purpose of the antiabrasion layer is to alleviate defects in the final etched plate which are caused by dirt, lint, and/or other air-borne foreign particles which may, in the course of manufacture or use of the film, find its way to the surface of the light-sensitive layer. The quantity of silica used in the emulsion can be varied over a considerable range of approximately 1 percent to 20 percent based on the content of gelatin in the systems and the preferred range is from 5 to 10 percent.

The photosensitive dispersions of this invention may be coated on other hydrophobic supports, preferably transparent, from those in the examples. For example, the hydrophobic organic polymer film may be composed of any hydrophobic organic polymer but films formed from the polyesterification product of a dicarboxylic acid and a dihydric alcohol made according to the teachings of Alles, Pat. No. 2,779,684 are especially useful. A 0.00025-inch antihalation layer containing a mixture of dyes can be coated on one surface of the support on a copolymer layer of Alles Pat. No. 2,779,684. Other hydrophobic organic polymer films suitable as strippable supports may be chosen from a wide variety of films such as polyolefins, e.g., polyethylene and polypropylene, polystyrene; polyamides, etc.

In place of gelatin as the binder in the dispersing medium, other natural or synthtic water-permeable organic binding agents water-permeable be used. Such agents include waterpermeable or water-soluble polyvinyl alcohol and its derivatives, e.g., partially hydrolyzed polyvinyl acetates, polyvinyl ethers, and acetals containing a large number of extralinear $-CH_2CHOH$ groups; hydrolyzed interpolymers of vinyl acetate and unsaturated addition polymerizable compounds such as maleic anhydride, acrylic and methacrylic acid ethyl esters and styrenes. Suitable colloids of the last mentioned type are disclosed in U. S. Pat. Nos. 2,276,322; 2,276,323; and 2,397,866. The useful polyvinyl acetals include polyvinyl acetaldehyde acetal, polyvinyl butyraldehyde acetal and polyvinyl sodium o-sulfobenzaldehyde acetal. Other useful colloid binding agents include the poly-N-vinyllactams of Bolton, U. S. Pat. No. 2,495,918, the hydrophilic copolymers of N-acrylamido alkyl betaines described in Shacklett, U. S. Pat. No. 2,833,650 and hydrophilic cellulose ethers and esters.

When it is desired to add a binder to the dispersed phase, useful binders are water-insoluble polymers, e.g., methyl methacrylate resins, polyvinyl acetals such as polyvinyl butyral and polyvinyl formal, vinylidene chloride copolymers, (e.g., vinylidene chloride/acrylonitrile, vinylidene chloride/methacrylate and vinylidene chloride/vinylacetate copolymer), synthetic rubbers, (e.g., butadiene/acrylonitrile copolymers, and chloro-2-butadiene-1,3-polymers), cellulose esters, (e.g., cellulose acetate, cellulose acetate succinate and cellulose acetate butyrate), polyvinyl esters, (e.g., polyvinyl acetate/acrylate, polyvinyl acetate/methacrylate and polyvinyl acetate/polyvinyl chloride) and copolymers, (e.g., polyvinyl chloride acetate), polyurethanes, polystyrene, etc. When materials such as the above are incorporated in the dispersed phases they may act as viscosity modifiers. For example the viscosity of the droplets may be increased to a point near a "threshold" value whereby an additional increase in viscosity through polymerization may effect a very noticeable change in some physical or chemical property.

Other useful polymeric binders for the dispersed phase are disclosed in Schoenthaler Pat. No. 3,418,295. These unsaturated polymers can be crosslinked or can be grafted to by growing monomer chains, thus producing an increased physical effect, particularly a greater hardening of the dispersed droplet. From 1 to 10 percent or more by weight of total solids, of a nonpolymerizable plasticizer may be employed in the organic phase of the photopolymerizable dispersion to improve the photographic speed. A preferred plasticizer is the mixed ester of triethylene glycol dicaprylate and dicaprate.

Suitable free-radical initiated, chain-propagating addition polymerizable ethylenically unsaturated compounds include preferably an alkylene or a polyalkylene glycol diacrylate prepared form an alkylene glycol of two to 15 carbons or a polyalkylene ether glycol of one to 10 ether linkages, and those disclosed in Martin and Barney U. S. Pat. No. 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester structures. The following specific compounds are further illustrative of this class; unsaturated esters of alcohols, preferably the unsaturated esters of polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bisacrylates and methacrylates of polyethylene glycols of molecular weight 200–500, and the like; vinyl esters such as divinyl succinate, divinyl adipate, divinyl phthalate and divinyl terephthalate; styrene and derivatives thereof and unsaturated aldehydes, such as sorbaldehyde (hexadienal). An outstanding class of these preferred addition polymerizable components are the esters of alpha-methylene carboxylic acid and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. In addition, the polymerizable, ethylenically unsaturated polymers of Burg, U. S. Pat. No. 3,043,805, Martin, U. S. Pat. No. 2,929,710 and similar materials may be used alone or mixed with other materials.

In addition to the initiating systems described above the materials capable of absorbing actinic radiation may be a cyanine, carbocyanine, or merocyanine dye. The various cyanine and related dyes have been well known in photography for many years and include such dyes as 3-ethyl-5-(2-ethyl-1-benzoxazylidene-$\beta$-methyl ethylidene)-2-thio-2,4 (3,5) oxazoledione (prepared as described in Example 16 of Kendall, U. S. Pat. No. 2,272,163 and dyes of the following formulae:

A
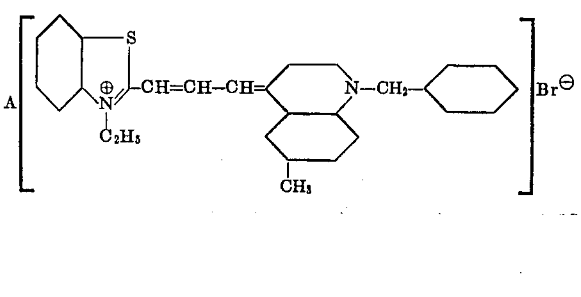

B
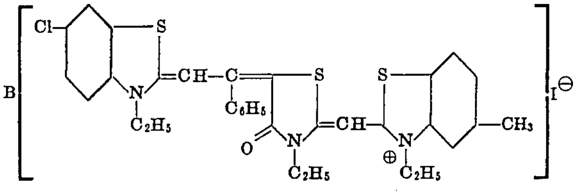

C
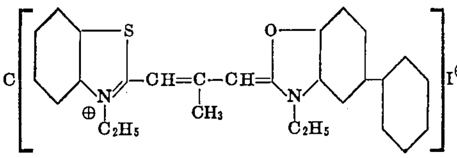

Suitable photoreducible dyes as described above have been disclosed more recently, e.g., in U.S. Pat. Nos. 2,850,445 and 2,875,047.

Also useful are combinations of one or more of the above dyes with quinone type compounds, e.g., phenanthrenequinone in combination with the dye prepared according to Example 16 of Kendall, U.S. Pat. No. 2,272,163. Other useful materials for absorbing actinic radiation are the free-radical generating addition polymerization initiators activatable by actinic light and thermally inactive at or below 185°C. These include the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tertbutylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro2-methylanthraquinone, retenequinone, 7,8,9,-10-tetrahydronaphthacenequinone, and 1,2,3,4-tetrahydrobenz(a)anthracene-7,12-dione. Other photoinitiators which are also useful, even though some may be thermally active at temperatures as low as 85°C., are described in Plambeck U.S. Pat. No. 2,760,863 and include vicinal ketaldonyl compounds, such as diacetyl, benzil, etc. $\alpha$-ketaldonyl alcohols, such as benzoin, pivaloin, etc., acyloin ethers, e.g., benzoin methyl and ethyl ethers, etc., $\alpha$ -hydrocarbon substituted aromatic acyloins, including $\alpha$-methylbenzoin, $\alpha$-allylbenzoin, and $\alpha$-phenylbenzoin.

Another suitable initiator system that can be used in the photopolymerizable dispersions and elements of this invention is the lophine dimers (2,4,5-triphenylimidazolyl dimers), consisting of two lophine radicals bound together by a single covalent bond, e.g., 2(o-chlorophenyl)-4,5-diphenylimidazolyl dimer and others, described in British Pat. Specification No. 997,396, published July 7, 1965, and 1,047,569, published Nov. 9, 1966. Suitable free radical producing hydrogen donor agents for use in such systems, e.g., organic amines, mercaptans, triphenylmethane dyes, are set forth in the above-stated British Specification Suitable color amine-substituted leuco dyes which function both as a color forming agent and a free radical generating agent can be used in the dispersions of this invention. Especially useful leuco dyes have at least one dialkylamino group. Also, any amine substituted leuco triphenylmethane dye or various salts of the dye can be used. Leuco forms of crystal violet which are oxidized upon exposure to form visible images are preferred. Other suitable leuco dyes or their salts are disclosed in Chang et al., U.S. application Ser. No. 731,733, filed May 24, 1968.

Since the elements of this invention are for use in a photopolymerizable process it is obvious that they should be stable against thermally initiated polymerization. Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2-6-di-tert-butyl *p*-cresol, phenothia-zine, pyridine, nitrobenzene and dinitrobenzene. Other useful inhibitors include *p*-toluquinone and chloranil and thiazine dyes, e.g., Thionine Blue G (C.I. Basic Blue 25), Methylene Blue B (C.I. Basic Blue 9) and Toluidine Blue 0 (C.I. Basic Blue 17). In the particularly preferred embodiments containing certain dye or quinone-type photoinitiators, however, no thermal inhibitor is required since these initiators ahve a dual function and, in the dark, serve as thermal inhibitors.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps.

The image, formed by exposure of a heterogeneous system of this invention, depends upon the differential polymerization of the individual droplets in the dispersed phase. Such differences may make the image visible without further treatment, e.g., it is often possible to see a visible image in the resist.

Although not essential, it is preferred that a surfactant be employed in dispersing the droplets. Such surfactants are alkylnaphthalene sulfonic acid salts, organic esters of phosphoric acid, benzyl alcohol, octyl alcohol, lauryl alcohol, sodium lauryl sulphate, sulphonated derivatives of fatty acid amides, the condensation products of octyl phenol and sorbitan monolaurate with polyethylene oxide, etc.

Additional low boiling solvents which are water immiscible include esters, (e.g. ethyl formate, propyl acetate, n-butyl acetate, ethyl butyrate), hydrocarbons, (e.g., benzene), chlorinated hydrocarbons, (e.g., chloroform, methylene chloride) and ethers, (e.g., diethyl ether.

The primary advantage of the heterogeneous photopolymerization system is reduced oxygen sensitivity. Oxygen is known to inhibit photopolymerization but it appears to have little effect in the heterogeneous systems of the present invention, particularly the systems wherein gelatin is used as the binder in the aqueous phase. Oxygen is relatively insoluble in gelatin and has a lower diffusion coefficient in gelatin than in many other binders. The reduced sensitivity to oxygen may explain, in part, the ability of the heterogeneous systems to produce continuous tone reproduction. The reproduction of continuous tones is probably dependent, also, on the variation in sensitivity between dispersed droplets of different sizes. This ability of the heterogeneous system to produce continuous tone images makes possible the use of photopolymerization in conventional photographic materials, particularly for contact or enlargement papers.

The heterogeneous photopolymerization system of this invention shows no significant low intensity reciprocity failure, probably because of its relative insensitivity to oxygen. Also it has been found that stability is excellent, both of the raw stock (unexposed material) and the final resist images that are produced by this process.

We claim:

1. A process for modifying the surface of an article bearing a photopolymerizable, resist-forming layer, said layer being comprised of a hydrophilic, macromolecular organic polymer dispersion medium including a dispersed phase containing at least one ethylenically unsaturated monomer having a boiling point above 100°C. at normal atmospheric pressure and being capable of forming a high polymer by free-radical initiated, chain-propagating addition polymerization and a free-radical generating photoinitiator system activatable by actinic radiation in an amount constituting from 0.01 to 20.0 percent by weight of the total solids in said dispersion, said monomer and initiator being the sole image forming system in the layer, comprising the steps of exposing said article to actinic radiation in an image pattern, and modifying the surface of said article in conformance with said image pattern by diffusing a treating fluid through the unpolymerized areas of said layer.

2. A process according to claim 1 having the additional step of removing the resist layer from the surface of said article.

3. A process according to claim 1 wherein said surface is selected from metals, organic polymers, and silicon dioxide.

4. A process according to claim 1 wherein said treating fluid is selected from plating solutions, etching solutions, and dyes.

5. A process for modifying the surface of an article which comprises a. exposing to actinic radiation in an image pattern a photopolymerizable element comprising a hydrophobic support transparent to actinic radiation and a photopolymerizable resist-forming layer, said layer being comprised of a hydrophilic macromolecular organic polymer dispersion medium including a dispersed phase containing at least one ethylenically unsaturated monomer having a boiling point above 100°C. at normal atmospheric pressure and being capable of forming a high polymer by free-radical initiated chain-propagating addition polymerization and a free-radical generating photoinitiator system activatable by actinic radiation in an amount constituting from 0.01 to 20.0 percent by weight of the total solids in said dispersion, said monomer and initiator being the sole image-forming system in the layer, said layer being strippable from said support,
b. adhering the surface of the photopolymerizable layer to the surface of said article in the presence of moisture,
c. stripping the support from said layer, and then d. modifying the surface of the article in conformance with the said image pattern by diffusion of a treating fluid through the unpolymerized areas of the adherent layer.

6. A process according to claim 5 having the additional step of treating the article to remove the resist and any residual treating fluid.

7. A process according to claim 5 wherein the adhering step precedes the exposing step.

8. A process according to claim 5 wherein the stripping step precedes the exposing step.

9. A process according to claim 5 having the subsequent step of diffusing a treating fluid through all areas of the adherent layer.

10. A process according to claim 5 for forming an intaglio image wherein said steps of exposing and adhering are carried out in either order and the step of modifying the surface of the article comprises etching said surface to produce an intaglio image in the surface.

11. A process according to claim 10 having the additional step of treating the surface to remove residual etching solution and the resist.

12. A process according to claim 10 wherein said surface is metal.

* * * * *